(12) United States Patent
Enomoto et al.

(10) Patent No.: US 12,428,242 B2
(45) Date of Patent: Sep. 30, 2025

(54) INFORMATION PROCESSING APPARATUS, TRANSFER POSITION CORRECTION METHOD, AND SUBSTRATE PROCESSING APPARATUS

(71) Applicant: Tokyo Electron Limited, Tokyo (JP)

(72) Inventors: Tadashi Enomoto, Iwate (JP); Nao Akashi, Hokkaido (JP); Youngtai Kang, Yamanashi (JP); Keishi Shionaga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 397 days.

(21) Appl. No.: 17/664,461

(22) Filed: May 23, 2022

(65) Prior Publication Data

US 2022/0388785 A1 Dec. 8, 2022

(30) Foreign Application Priority Data

Jun. 4, 2021 (JP) ................................. 2021-094650

(51) Int. Cl.
*B65G 47/90* (2006.01)
*G06T 7/00* (2017.01)
*G06T 7/73* (2017.01)
*H01L 21/68* (2006.01)

(52) U.S. Cl.
CPC ............ *B65G 47/905* (2013.01); *G06T 7/001* (2013.01); *G06T 7/74* (2017.01); *H01L 21/681* (2013.01); *G06T 2207/30148* (2013.01)

(58) Field of Classification Search
None
See application file for complete search history.

(56) References Cited

U.S. PATENT DOCUMENTS 5,566,076 A * 10/1996 Kuroda ............. H01L 21/67057
700/213
6,368,049 B1 * 4/2002 Osaka ................... H01L 21/681
414/331.01

(Continued)

FOREIGN PATENT DOCUMENTS

JP 2019-046843 3/2019

*Primary Examiner* — Hua Lu
(74) *Attorney, Agent, or Firm* — IPUSA, PLLC

(57) ABSTRACT

An information processing apparatus for controlling a conveying apparatus to convey a substrate to be processed by a substrate processing apparatus includes a processor that performs operations including controlling the conveying apparatus, according to teaching data, to perform a first movement operation including putting the substrate into a container configured to carry the substrate and a second movement operation including getting the substrate from the container, acquiring image data including an image of a placement position for the substrate in the container during the first movement operation and the second movement operation, performing image processing on the image data to quantify a relationship between a position of the container and a position of the substrate, determining the quantified relationship to yield a determination result, and outputting correction data for correcting the conveying apparatus with respect to the first movement operation and the second movement operation, based on the determination result.

10 Claims, 11 Drawing Sheets

(56) References Cited

U.S. PATENT DOCUMENTS

| | | | |
|---|---|---|---|
| 2003/0231950 A1* | 12/2003 | Raaijmakers | H01L 21/681 |
| | | | 414/935 |
| 2004/0151574 A1* | 8/2004 | Lu | H01L 21/681 |
| | | | 414/936 |
| 2009/0222135 A1* | 9/2009 | Asakawa | H01L 21/681 |
| | | | 901/14 |
| 2012/0027547 A1* | 2/2012 | Jager | H01L 21/67346 |
| | | | 414/287 |
| 2012/0118083 A1* | 5/2012 | Mori | H01L 21/67265 |
| | | | 73/864.91 |
| 2014/0176701 A1* | 6/2014 | Okuno | H01L 21/67742 |
| | | | 348/125 |
| 2015/0219439 A1* | 8/2015 | Kondoh | H01L 21/67766 |
| | | | 356/614 |
| 2018/0363161 A1* | 12/2018 | Takahashi | C25D 17/008 |
| 2019/0164928 A1* | 5/2019 | Yoshino | H01L 24/78 |
| 2021/0074567 A1* | 3/2021 | Safrani | H01L 21/681 |

\* cited by examiner

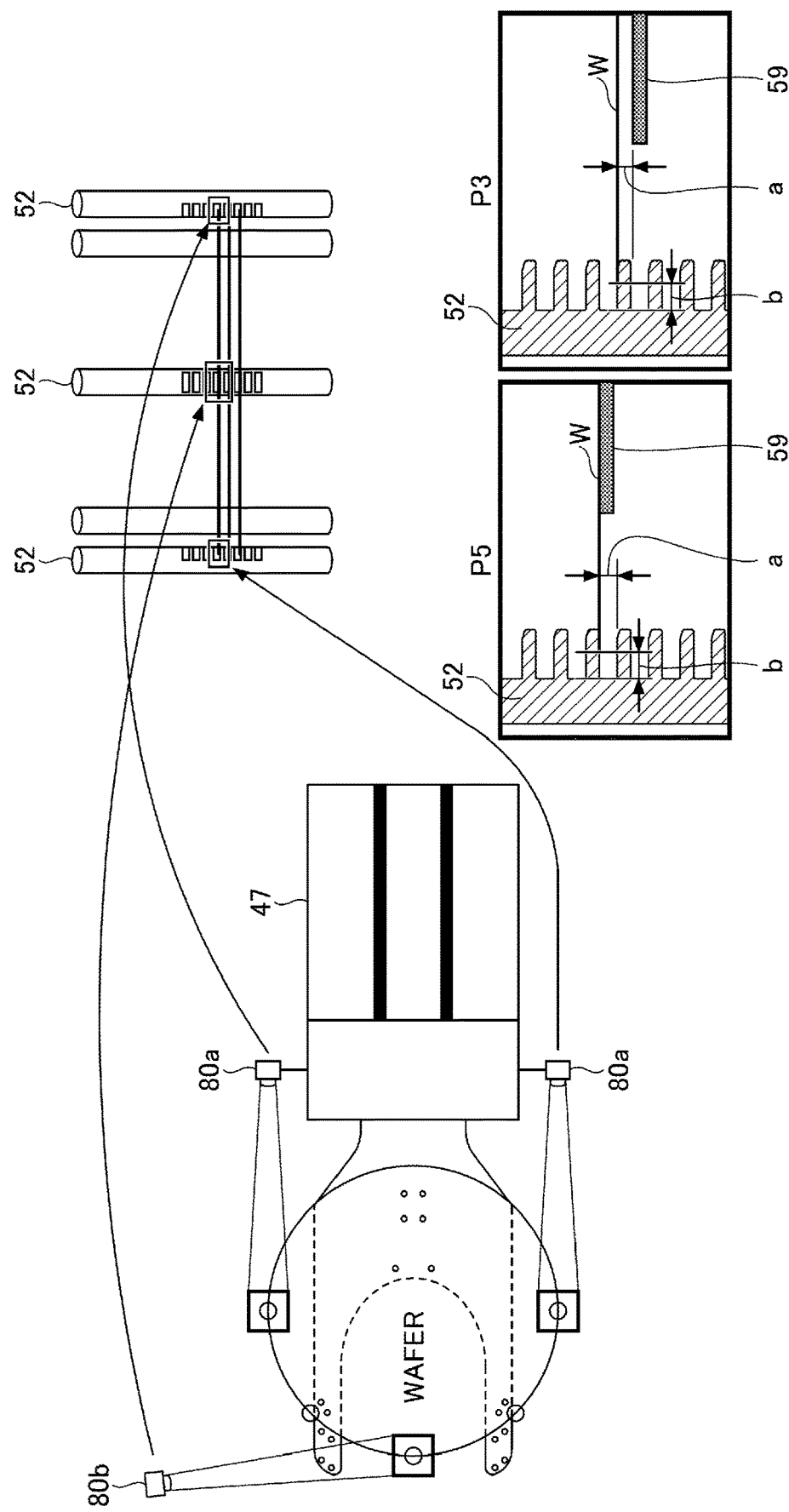

INFORMATION PROCESSING APPARATUS, TRANSFER POSITION CORRECTION METHOD, AND SUBSTRATE PROCESSING APPARATUS

CROSS-REFERENCE TO RELATED APPLICATION

The present application is based on and claims priority to Japanese Priority Application No. 2021-094650 filed on Jun. 4, 2021, the entire contents of which are hereby incorporated herein by reference.

BACKGROUND OF THE INVENTION

1. Field of the Invention

The present disclosure relates to an information processing apparatus, a transfer position correction method, and a substrate processing apparatus.

2. Description of the Related Art

A conventional vertical thermal processing apparatus includes a vertical thermal processing furnace, and multiple wafers on a wafer boat are accommodated in the thermal processing furnace, in which thermal processing is performed to heat the wafers. In this vertical thermal processing apparatus, a wafer conveying apparatus including multiple forks conveys multiple wafers accommodated on a carrier to a wafer boat at the same time (for example, see Japanese Laid-Open Patent Publication No. 2019-046843).

SUMMARY OF THE INVENTION

According to an aspect of the present disclosure, an information processing apparatus for controlling a conveying apparatus to convey a substrate to be processed by a substrate processing apparatus includes:
  a processor; and
  a memory storing instructions that, when executed by the processor, perform operations including:
  controlling the conveying apparatus, according to teaching data, to perform a first movement operation including putting the substrate into a container configured to carry the substrate and a second movement operation including getting the substrate from the container;
  acquiring image data including an image, captured by an imaging apparatus, of a placement position for the substrate in the container during the first movement operation and the second movement operation;
  performing image processing on the image data to quantify a relationship between a position of the container and a position of the substrate; and
  determining the quantified relationship between the position of the container and the position of the substrate to yield a determination result, and
  outputting correction data for correcting the conveying apparatus with respect to the first movement operation and the second movement operation, based on the determination result.

BRIEF DESCRIPTION OF THE DRAWINGS

FIG. 7 is a schematic illustration of an example of a boat into which a fork is inserted.

DETAILED DESCRIPTION OF THE PREFERRED EMBODIMENTS

Figure 1:
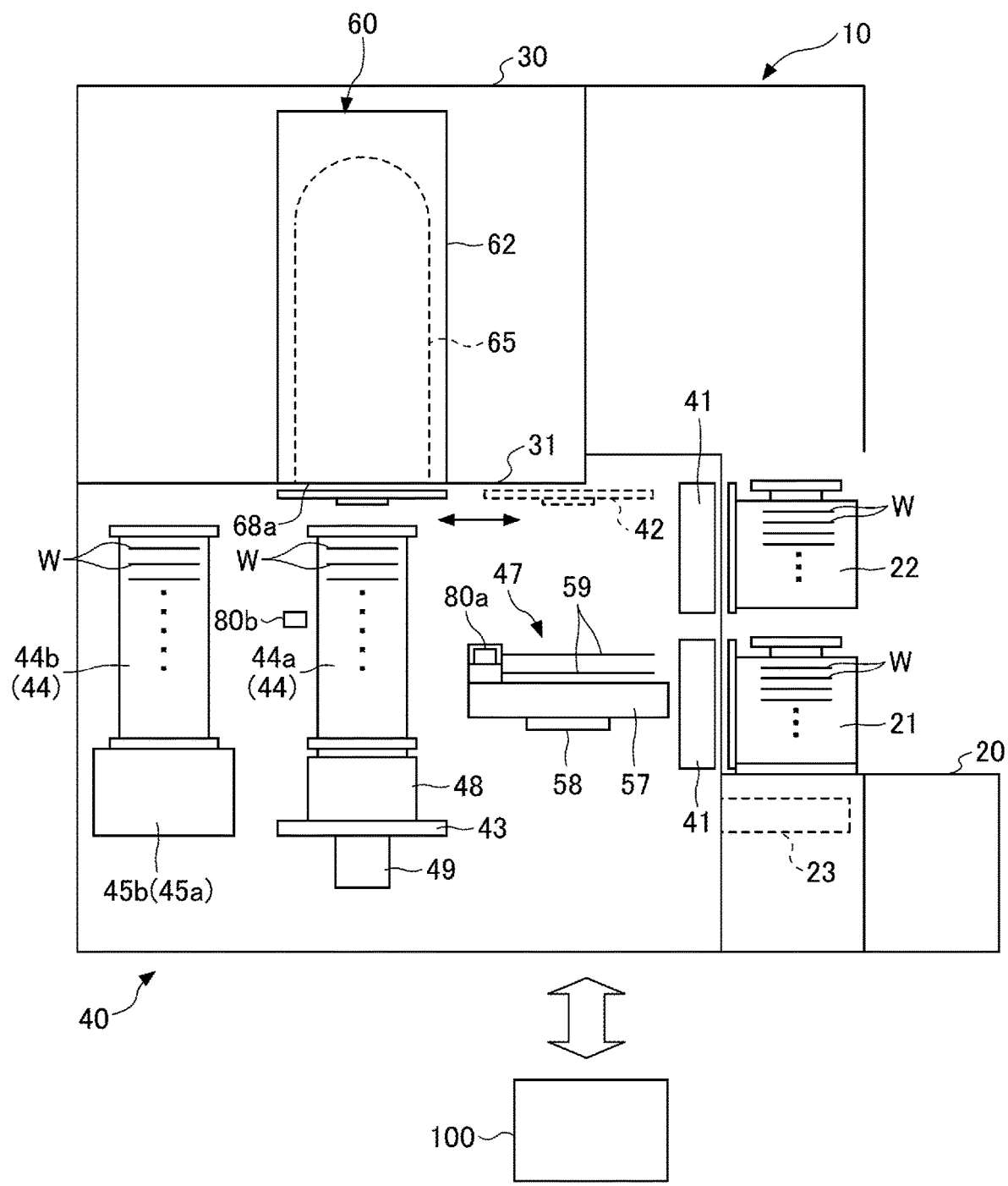
FIG. 1 is a cross-sectional view schematically illustrating an example of a substrate processing system according to the present embodiment.

The present disclosure provides a technique for autonomously controlling a conveying apparatus to convey a substrate.

Hereinafter, embodiments are described with reference to the attached drawings. In the present specification and drawings, components having substantially the same functionals are denoted with the same reference numerals, and duplicate description thereabout is omitted. In the present disclosure, a thermal processing apparatus is explained as an example of a substrate processing apparatus, but the thermal processing apparatus is merely an example, and the present disclosure is not limited thereto.

First Embodiment

Figure 2:
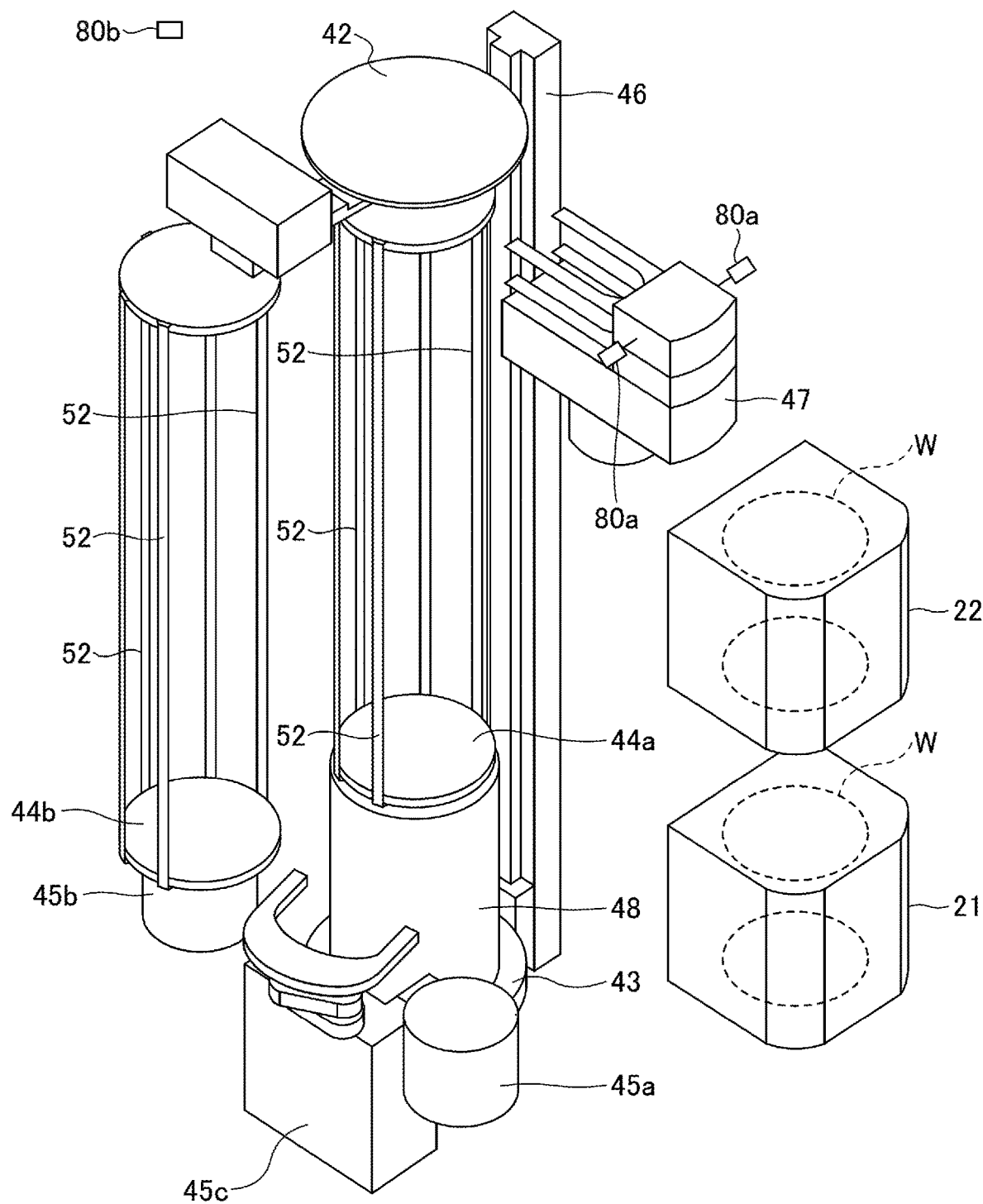
FIG. 2 is a perspective view schematically illustrating an example of a loading area.

FIG. 1 is a cross-sectional view schematically illustrating an example of a substrate processing system according to the present embodiment. FIG. 2 is a perspective view schematically illustrating an example of a loading area. As illustrated in FIG. 1, the substrate processing system includes a thermal processing apparatus 10 and a control apparatus 100. The control apparatus 100 may be provided inside the housing of the thermal processing apparatus 10 as a part of the configuration of the thermal processing apparatus 10, or may be provided outside the housing of the thermal processing apparatus 10 separately from the configuration of the thermal processing apparatus 10. For example, the control apparatus 100 may be implemented as a server apparatus connected to perform data communication via a network, a cloud service provided via a network, or the like.

The thermal processing apparatus 10 includes a vertical thermal processing furnace 60, explained later, to hold and accommodate multiple wafers W on a boat with predetermined intervals along the vertical direction and perform various kinds of thermal processing such as oxidation, diffusion, low-pressure chemical vapor deposition (LPCV), or the like on the wafers W. Hereinafter, it is assumed that, for example, the thermal processing apparatus 10 oxidizes the surfaces of the wafers W by supplying processing gas to the wafers W provided in a processing container 65 explained later. The wafer W is an example of a substrate, and the substrate is not limited to the wafer W in a circular shape.

The thermal processing apparatus 10 as illustrated in FIG. 1 includes a load port 20, a housing 30, and a control apparatus 100. The load port 20 is provided on the front of the housing 30. The housing 30 includes a loading area (a work area) 40 and a thermal processing furnace 60.

The loading area 40 is provided in the lower part of the housing 30. The thermal processing furnace 60 is provided above the loading area 40 in the housing 30. Also, a base plate 31 is provided between the loading area 40 and the thermal processing furnace 60.

The load port 20 is configured to load wafers W into the housing 30 and unload wafers W from the housing 30. The containers 21 and 22 are placed on the load port 20. The containers 21 and 22 are front opening unified pods (FOUPs) that have a detachable lid in the front and that can store multiple wafers W (for example, about 25 wafers W) with predetermined intervals.

An aligner 23 may be provided below the load port 20 to align in a single direction a cutout (for example, a notch) provided in the outer circumference of the wafer W transferred from a transfer mechanism 47 explained later.

The loading area (the work area) 40 allows wafers W to be transferred between the containers 21 and 22 and a boat 44 explained later, allows the boat 44 to be loaded into the processing container 65, and allows the boat 44 to be unloaded from the processing container 65. The loading area 40 includes a door mechanism 41, a shutter mechanism 42, a lid 43, the boat 44, a holder 45a, a holder 45b, an elevation mechanism 46, and a transfer mechanism 47.

The door mechanism 41 is provided so that the containers 21 and 22 and the loading area 40 can be brought into communication with each other by removing the lids of the containers 21 and 22. The shutter mechanism 42 is provided in the upper part of the loading area 40. The shutter mechanism 42 is provided to cover (or close) a furnace port 68a in order to alleviate or prevent heat radiation from the furnace port 68a explained later to the loading area 40 when the lid 43 is open.

The lid 43 includes an insulation tube 48 and a rotation mechanism 49. The insulation tube 48 is provided on the lid 43. The insulation tube 48 prevents the boat 44 from being cooled due to heat conduction with the lid 43 and keeps the boat 44 warm. The rotation mechanism 49 is provided below the lid 43. The rotation mechanism 49 is configured to rotate the boat 44. The shaft of the rotation mechanism 49 is provided to penetrate the lid 43 airtightly and rotate a rotation table (not illustrated) provided on the lid 43.

The elevation mechanism 46 elevates and rotates the lid 43 to load the boat 44 to the loading area 40 or unload the boat 44 from the processing container 65. Then, when the lid 43 elevated by the elevation mechanism 46 is loaded into the processing container 65, the lid 43 comes into contact with the furnace port 68a explained later to airtightly seal the furnace port 68a. The boat 44 placed on the lid 43 can store the wafers W in the processing container 65 rotatably within the horizontal plane.

The thermal processing apparatus 10 may include multiple boats 44. In the present embodiment, an example where two boats 44 are provided is explained with reference to FIG. 2.

In the loading area 40, boats 44a and 44b are provided. In the loading area 40, the holder 45a, the holder 45b, and the boat conveying mechanism 45c are provided. The holders 45a and 45b are loading ports through which the boats 44a and 44b, respectively, are transferred from the lid 43. The boat conveying mechanism 45c is configured to transfer the boat 44a or 44b from the lid 43 to the holder 45a or 45b.

The boats 44a and 44b are made from, for example, quartz, and are configured to store wafers W with a large diameter, for example, a diameter of 300 mm, in a horizontal orientation with predetermined intervals (i.e., a pitch width) in the vertical direction. In the boats 44a and 44b, for example, multiple support pillars 52 (for example, three support pillars 52) are provided between the top panel and the bottom plate. Each of the support pillars 52 includes support portions such as grooves or claws for supporting (holding) the wafers W. The boats 44a and 44b may be provided with auxiliary pillars in addition to the support pillars 52. The boats 44a and 44b are examples of containers into which the wafer W can be put.

The transfer mechanism 47 is configured to transfer wafers W between the container 21 or 22 and the boat 44a or 44b. The transfer mechanism 47 is an example of a conveying apparatus for conveying wafers W.

The transfer mechanism 47 includes a holder 57, an elevation arm 58, and multiple forks 59. The holder 57 is provided to be able to elevate and rotate. The elevation arm 58 is provided to be able to move (elevate) in the vertical direction with a ball screw or the like. The holder 57 is provided on the elevation arm 58 to be able to rotate horizontally. Multiple forks are an example of a transfer plate (a transfer unit) for supporting the wafer W.

In the loading area 40, cameras 80a and 80b are provided. The cameras 80a and 80b are examples of imaging apparatuses. The cameras 80a are provided to be able to capture an image from the transfer mechanism 47 in the direction of the container 21 or 22 and to capture an image from the transfer mechanism 47 in the direction of the boat 44a or 44b. FIG. 1 and FIG. 2 illustrate an example in which the cameras 80a are provided on a movable unit of the transfer mechanism 47.

For example, the cameras 80a capture an image of a movement operation in which the transfer mechanism 47 gets the wafer W from the container 21 or 22 and also capture an image of a movement operation in which the transfer mechanism 47 puts the wafer W into the boat 44a or 44b. In addition, the cameras 80a capture an image of a movement operation in which the transfer mechanism 47 gets the wafer W from the boat 44a or 44b and also capture an image of a movement operation in which the transfer mechanism 47 puts the wafer W into the container 21 or 22.

Also, the camera 80b of FIG. 1 and FIG. 2 is provided to be able to capture an image of the back side of the boat 44a or 44b, as seen from the side of the transfer mechanism 47. FIG. 1 and FIG. 2 illustrate an example in which the camera 80b is provided on the wall of the housing 30.

For example, the camera 80b captures an image of a movement operation in which the transfer mechanism 47 puts the wafer W into the boat 44a or 44b. Also, the camera 80b captures an image of a movement operation in which the transfer mechanism 47 gets the wafer W from the boat 44a or 44b.

The control apparatus 100 is an apparatus that controls the entirety of the thermal processing apparatus 10. The control apparatus 100 controls the operation of the thermal processing apparatus 10 so that thermal processing is performed under various processing conditions indicated by recipes. In addition, the control apparatus 100 executes full automatic teaching processing for automating teaching of the transfer mechanism 47 with respect to the transfer position of the wafer W, autonomous automatic transfer processing for performing autonomous control (autonomous navigation control) of the transfer mechanism 47 to convey the wafer W, abnormality predictive detection processing for supporting preventive maintenance activities of the transfer mechanism 47, and the like, as explained later.

Figure 3:
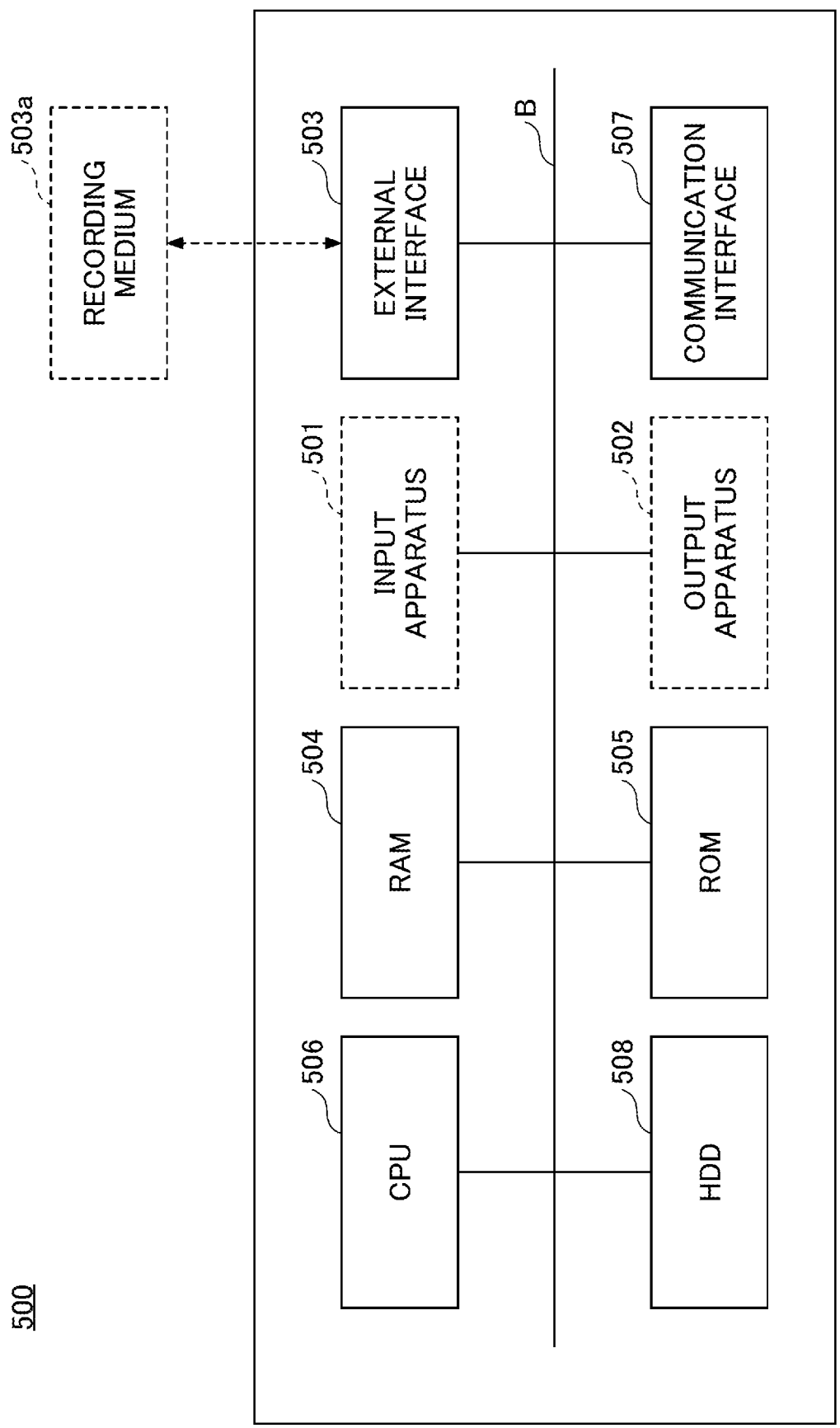
FIG. 3 is a hardware configuration diagram illustrating an example of a computer.

The control apparatus 100 is implemented by, for example, a computer 500 with a hardware configuration as illustrated in FIG. 3. FIG. 3 is a hardware configuration diagram illustrating the computer 500.

The computer 500 of FIG. 3 includes an input apparatus 501, an output apparatus 502, an external interface 503, a random access memory (RAM) 504, a read only memory (ROM) 505, a central processing unit (CPU) 506, a communication interface 507, hard disk drive (HDD) 508, and the like, which are connected with one another via a bus B. The input apparatus 501 and the output apparatus 502 may be configured to be connected and used as necessary.

The input apparatus 501 is a keyboard, a mouse, a touch panel, and the like, and is used by a worker to input operation signals. The output apparatus 502 is a display or the like, and displays a processing result of the computer 500. The communication interface 507 is an interface for connecting the computer 500 to a network. The HDD 508 is an example a non-volatile storage device for storing programs and data.

The external interface 503 is an interface for connection with an external apparatus. The computer 500 can read and/or write a recording medium 503a such as SD (Secure Digital) memory card and the like via the external interface 503. The ROM 505 is an example of a non-volatile semiconductor memory (storage device) storing programs and data. The RAM 504 is an example of a volatile semiconductor memory (storage device) temporarily storing programs and data.

The CPU 506 is a computation apparatus that achieves control and functions of the entirety of the computer 500 by reading programs and data from a storage device such as the ROM 505 and the HDD 508 to the RAM 504 and executing processing.

The control apparatus 100 can achieve various functions explained later by causing the computer 500 having the hardware configuration of FIG. 3 to execute processing according to programs.

<Functional Configuration>

Figure 4:
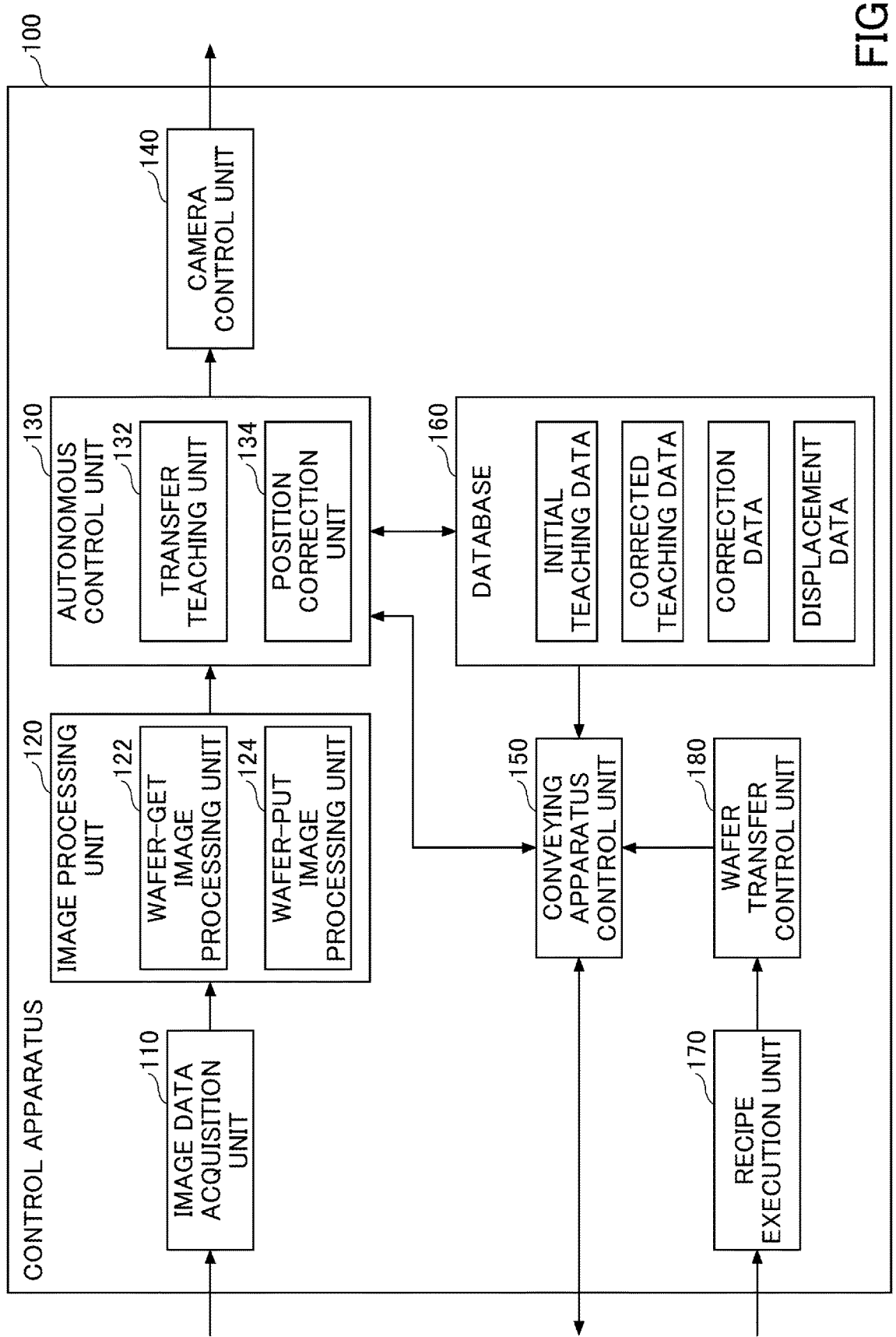
FIG. 4 is a diagram illustrating an example of functional configuration of a control apparatus.

An example of a functional configuration of the control apparatus 100 is explained with reference to FIG. 4. FIG. 4 is a diagram illustrating an example of functional configuration of the control apparatus. The control apparatus 100 includes an image data acquisition unit 110, an image processing unit 120, an autonomous control unit 130, a camera control unit 140, a conveying apparatus control unit 150, a database 160, a recipe execution unit 170, and a wafer transfer control unit 180.

The image processing unit 120 includes a wafer-get image processing unit 122 and a wafer-put image processing unit 124. The autonomous control unit 130 includes a transfer teaching unit 132 and a position correction unit 134. In the functional configuration of FIG. 4, explanation about elements that are not necessary for the explanation about the present embodiment are omitted as appropriate.

The image data acquisition unit 110 acquires image data captured by the cameras 80a and 80b (hereinafter, the cameras 80a and 80b are collectively referred to as cameras 80 as necessary). For example, the image data acquisition unit 110 acquires image data of a movement operation in which the transfer mechanism 47 gets the wafer W from the container 21 or 22 and acquires image data of a movement operation in which the transfer mechanism 47 puts the wafer W into the boat 44a or 44b. In addition, for example, the image data acquisition unit 110 acquires image data of a movement operation in which the transfer mechanism 47 gets the wafer W from the boat 44a or 44b and acquires image data of a movement operation in which the transfer mechanism 47 puts the wafer W into the boat 44a or 44b.

The image processing unit 120 performs image processing on image data acquired by the image data acquisition unit 110 to analyze (measure) the required distance (size) from the position of the support portion such as a groove or a claw of the container 21 or 22, the position of the fork 59 of the transfer mechanism 47, and the position of the wafer W, thus quantifying the relationship in position. Hereinafter, an example in which the support portions of the container 21 or 22 are grooves is explained.

Furthermore, the image processing unit 120 performs image processing on image data acquired by the image data acquisition unit 110 to analyze (measure) the required distance (size) from the position of the support portion such as a groove or a claw of the boat 44a or 44b, the position of the fork 59 of the transfer mechanism 47, and the position of the wafer W, thus quantifying the relationship in position. Hereinafter, an example in which the support portions of the boat 44a or 44b are grooves is explained.

The wafer-get image processing unit 122 of the image processing unit 120 performs image processing on image data of the movement operation for acquiring the wafer W from the container 21 or 22 to analyze the required distance from the position of the groove of the container 21 or 22, the position of the fork 59 of the transfer mechanism 47, and the position of the wafer W, thus quantifying the relationship in position.

Furthermore, the wafer-get image processing unit 122 of the image processing unit 120 performs image processing on image data of the movement operation for acquiring the wafer W from the boat 44a or 44b to analyze the required distance from the position of the groove of the boat 44a or 44b, the position of the fork 59 of the transfer mechanism 47, and the position of the wafer W, thus quantifying the relationship in position.

The wafer-put image processing unit 124 of the image processing unit 120 performs image processing on image data of the movement operation for putting the wafer W on the boat 44a or 44b to analyze the required distance from the position of the groove of the boat 44a or 44b, the position of the fork 59 of the transfer mechanism 47, and the position of the wafer W, thus quantifying the relationship in position.

Furthermore, the wafer-put image processing unit 124 of the image processing unit 120 performs image processing on image data of the movement operation for putting the wafer W on the container 21 or 22 to analyze the required distance from the position of the groove of the container 21 or 22, the position of the fork 59 of the transfer mechanism 47, and the position of the wafer W, thus quantifying the relationship in position.

The autonomous control unit 130 calculates corrected teaching data of the placement position of the wafer W in the container 21 or 22, on the basis of the relationship between the position of the groove of the container 21 or 22, the position of the fork 59 of the transfer mechanism 47, and the position of the wafer W, which has been quantified, and teaches the transfer mechanism 47 with respect to the transfer position of the wafer W. For example, the corrected teaching data of the placement position of the wafer W in the container 21 or 22 is used to correct initial teaching data of the movement operation in which the forks 59 of the transfer mechanism 47 get the wafer W from the container 21 or 22 or the movement operation in which the forks 59 of the transfer mechanism 47 put the wafer W on the container 21 or 22.

The autonomous control unit 130 calculates corrected teaching data of the placement position of the wafers W on the boat 44a or 44b, on the basis of the relationship between the position of the groove of the boat 44a or 44b, the position of the fork 59 of the transfer mechanism 47, and the position of the wafers W, which has been quantified, and teaches the transfer mechanism 47 with respect to the transfer position of the wafer W. For example, the corrected teaching data of the placement position of the wafer W in the boat 44a or 44b is used to correct initial teaching data of the movement operation in which the forks 59 of the transfer mechanism 47 get the wafer W from the boat 44a or 44b or the movement operation in which the forks 59 of the transfer mechanism 47 put the wafer W on the boat 44a or 44b.

Furthermore, the autonomous control unit 130 measures with predetermined intervals the transfer position of the wafer W transferred between the container 21 or 22 and the boat 44a or 44b according to the corrected teaching data, and in a case where there occurs a misalignment, the autonomous control unit 130 can perform autonomous navigation processing by performing position correction explained later.

The transfer teaching unit 132 of the autonomous control unit 130 performs image processing on image data of the movement operation for acquiring the wafer W from the container 21 or 22, on the basis of the relationship between the position of the groove of the container 21 or 22, the position of the fork 59 of the transfer mechanism 47, and the position of the wafer W, which has been quantified, and calculates the corrected teaching data of the placement position of the wafer W in the container 21 or 22.

Furthermore, the transfer teaching unit 132 of the autonomous control unit 130 performs image processing on image data of the movement operation for acquiring the wafer W from the boat 44a or 44b, on the basis of the relationship between the position of the groove of the boat 44a or 44b, the position of the fork 59 of the transfer mechanism 47, and the position of the wafer W, which has been quantified, and calculates the corrected teaching data of the placement position of the wafer W in the boat 44a or 44b.

Furthermore, the transfer teaching unit 132 of the autonomous control unit 130 performs image processing on image data of the movement operation for putting the wafer W on the boat 44a or 44b, on the basis of the relationship between the position of the groove of the boat 44a or 44b, the position of the fork 59 of the transfer mechanism 47, and the position of the wafer W, which has been quantified, and calculates the corrected teaching data of the placement position of the wafer W in the boat 44a or 44b.

Furthermore, the transfer teaching unit 132 of the autonomous control unit 130 performs image processing on image data of the movement operation for putting the wafer W on the container 21 or 22, on the basis of the relationship between the position of the groove of the container 21 or 22, the position of the fork 59 of the transfer mechanism 47, and the position of the wafer W, which has been quantified, and calculates the corrected teaching data of the placement position of the wafer W in the container 21 or 22.

Furthermore, the position correction unit 134 of the autonomous control unit 130 measures with predetermined intervals the transfer position of the wafer W transferred between the container 21 or 22 and the boat 44a or 44b according to the corrected teaching data, and in a case where there occurs a misalignment, the position correction unit 134 can perform autonomous navigation processing by performing position correction explained later.

The camera control unit 140 controls image capturing timing of the cameras 80 according to instructions from the autonomous control unit 130. The database 160 stores initial teaching data and corrected teaching data for teaching the transfer mechanism 47 of the thermal processing apparatus 10 with respect to the placement position of the wafer W. In addition, the database 160 stores correction data and displacement data used for position correction explained later.

For example, the initial teaching data is teaching data that is set in advance in the thermal processing apparatus 10, and is set for each model of the thermal processing apparatus 10. The corrected teaching data is teaching data in which a misalignment of the placement position of the wafer W due to an individual difference of the thermal processing apparatus 10 and variation in the adjustment depending on the worker have been corrected. The correction data is used to continue transfer of the wafer W upon correcting the occurred misalignment of the placement position of the wafer W in the basis of, for example, results obtained by periodically measuring the transfer position of the wafer W transferred according to the corrected teaching data. Furthermore, the displacement data is data obtained by continuously recording occurred misalignment of the placement position of the wafer W, and is used for analyzing various kinds of analysis (tendency, action, malfunction, abnormality, or the like).

The conveying apparatus control unit 150 controls the movement operation of the transfer mechanism 47 in accordance with control by the autonomous control unit 130 or the wafer transfer control unit 180. The conveying apparatus control unit 150 controls the movement operation of the transfer mechanism 47 by using the initial teaching data, corrected teaching data, and correction data stored in the database 160.

The recipe execution unit 170 controls the operation of the thermal processing apparatus 10 such that thermal processing is performed under processing conditions indicated in the recipe. The wafer transfer control unit 180 gives instructions to the conveying apparatus control unit 150 so that the wafer W is conveyed between the container 21 or 22 and the boat 44a or 44b in accordance with the control of the recipe execution unit 170.

<Processing>

Figure 5:
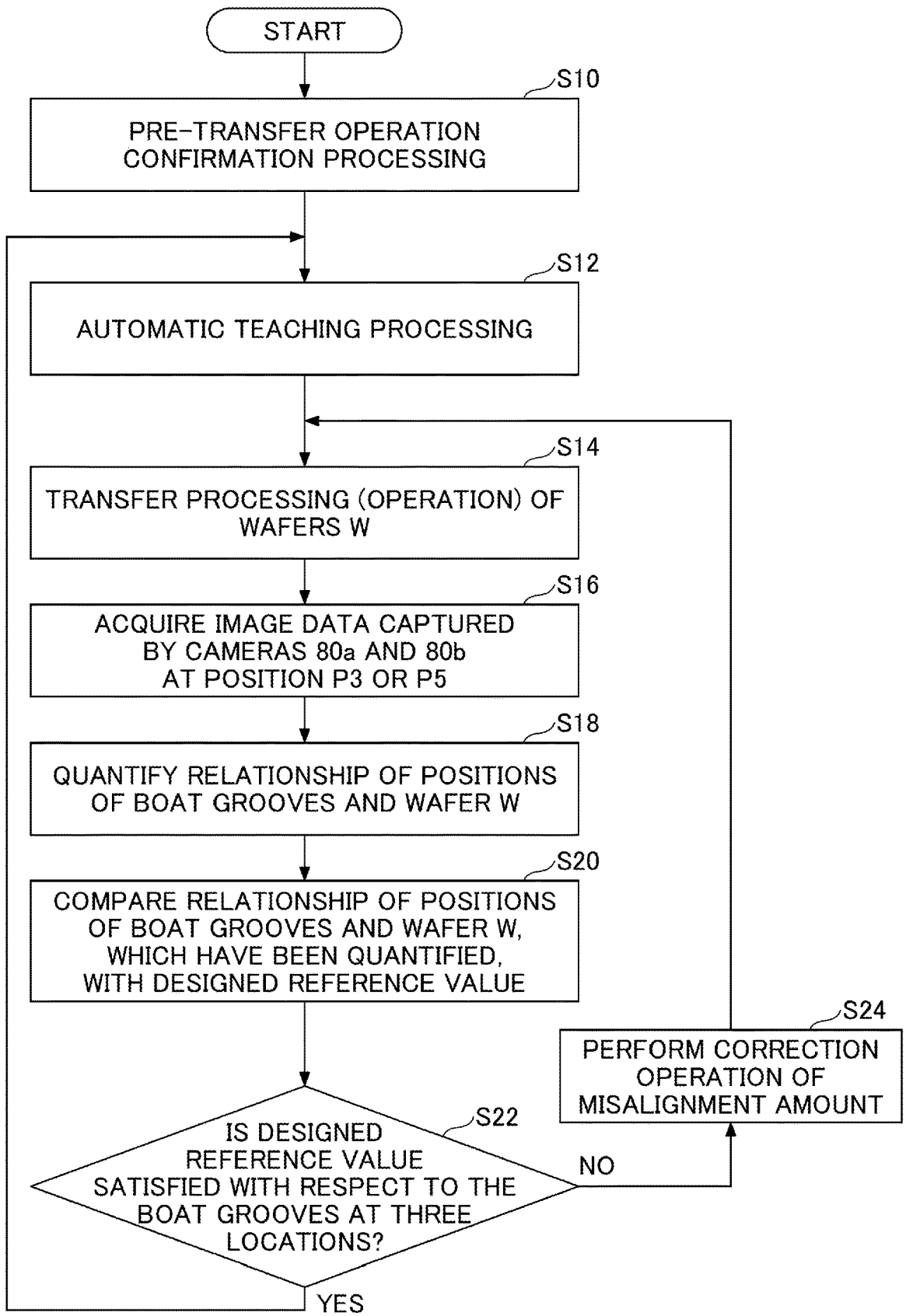
FIG. 5 is a flowchart of an example of processing for controlling movement operation of a transfer mechanism according to the present embodiment.

Hereinafter, an example of full automatic teaching processing for automating teaching of the transfer mechanism 47 that conveys the wafer W between the container 21 or 22 and the boat 44a or 44b and autonomous transfer processing for performing autonomous control (autonomous navigation control) for conveying the wafer W with the transfer mechanism 47 is explained. The control apparatus 100 controls the movement operation of the transfer mechanism 47 according to, for example, the procedure of FIG. 5. FIG. 5 is a flowchart of an example of processing for controlling movement operation of the transfer mechanism according to the present embodiment.

In step S10, the control apparatus 100 performs pre-transfer operation confirmation processing. The pre-transfer operation confirmation processing of step S10 is confirmation processing before the transfer operation, and is processing for confirming the transfer positions of the container 21 or 22 and the boat 44a or 44b by performing a movement operation of the forks 59 of the transfer mechanism 47 on the basis of the initial teaching data without conveying the wafer W.

Figure 6A:
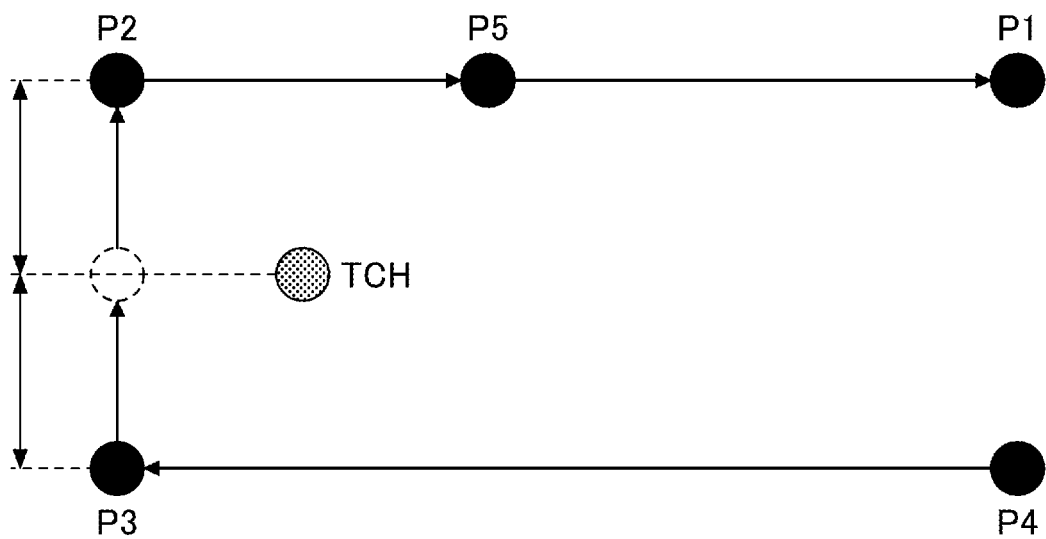
FIGS. 6A and 6B are explanatory diagrams illustrating an example of position change of a movement operation with a fork in a case where a wafer W is gotten or put.
Figure 6B:
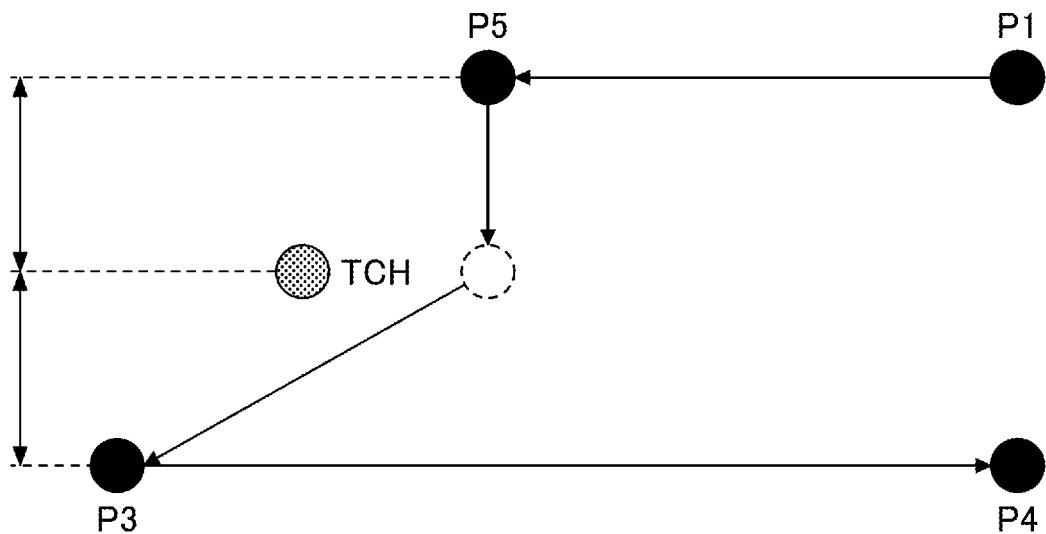

In the present embodiment, changes in the position of the movement operation of the forks 59 and the positions where the cameras 80 perform image capture, in a case where the wafer W is gotten from the placement position or the wafer W is put on the placement position, are defined, for example, as shown in FIGS. 6A and 6B.

FIGS. 6A and 6B are explanatory diagrams illustrating an example of a change in position in a movement operation of forks in a case where the wafer W is gotten or put. FIG. 6A illustrates an example of change in position in a movement operation of the fork 59 in a case where the wafer W is gotten. FIG. 6B illustrates an example of change in position in a movement operation of the fork 59 in a case where the wafer W is put.

For example, FIG. 6A illustrates an example of a movement operation in which the fork 59 is moved from the position P4 to the positions P3, P2, P5, and P1 in this order. The position P3 of FIG. 6A is an example of a first position, and is, for example, a position immediately before the fork 59 gets the wafer W from the boat 44a or 44b. A position TCH is, for example, a position where the fork 59 gets the wafer W from the boat 44a or 44b. The position P2 is, for example, a position after the fork 59 gets the wafer W from the boat 44a or 44b.

For example, FIG. 6B illustrates an example of a movement operation in which the fork 59 is moved from the position P1 to the positions P5, P3, and P4 in this order. The position P5 of FIG. 6B is an example of a second position, and is, for example, a position immediately before the fork 59 puts the wafer W into the boat 44a or 44b. The position TCH is, for example, a position where the fork 59 puts the wafer W into the boat 44a or 44b. The position P3 is, for example, a position after the fork 59 puts the wafer W into the boat 44a or 44b.

Boat-side pre-transfer operation confirmation processing is performed, for example, as follows. The autonomous control unit 130 of the control apparatus 100 reads initial teaching data from the database 160. The autonomous control unit 130 controls the conveying apparatus control unit 150 so as to insert the fork 59 into the position P3 of the boat 44a on the basis of the initial teaching data.

The autonomous control unit 130 controls the cameras 80 to capture images at the positions P3 and P5 of the boat 44a. The image data acquisition unit 110 acquires image data which the cameras 80 capture at the positions P3 and P5 of the boat 44a. The image processing unit 120 performs image processing on image data captured at the positions P3 and P5 of the boat 44a to measure the distance between the upper portion of the groove of the support pillar 52 of the boat 44a (hereinafter referred to as a boat groove) and the wafer placement surface of the fork 59. The image processing unit 120 measures the distance between the edge of the boat groove and the edge of the fork 59.

The autonomous control unit 130 determines whether the distance between the upper portion of the boat groove and the wafer placement surface of the fork 59 measured at the positions P3 and P5 of the boat 44a and the distance between the edge of the boat groove and the edge of the fork 59 satisfy designed reference values. When the designed reference values are not satisfied, the autonomous control unit 130 performs a correction operation of the amount of error, and performs position correction such that the movement operation of the fork 59 satisfies the designed reference value. The autonomous control unit 130 performs feedback by storing the corrected teaching data into the database 160 in accordance with a result of the position correction of the movement operation of the fork 59 that is performed so as to satisfy the designed reference value.

After the boat-side pre-transfer operation confirmation processing, the control apparatus 100 performs container-side pre-transfer operation confirmation processing. The size of the groove of the container 21 (hereinafter referred to as a container groove) is sufficiently larger than the boat groove, and therefore, the container-side pre-transfer operation confirmation processing may be omitted.

The autonomous control unit 130 of the control apparatus 100 reads initial teaching data from the database 160. The autonomous control unit 130 controls the conveying apparatus control unit 150 so as to insert the fork 59 into the position P3 of the container 21 on the basis of the initial teaching data.

The autonomous control unit 130 controls the cameras 80a to capture images at the positions P3 and P5 of the container 21. The image data acquisition unit 110 acquires image data which the cameras 80a capture at the positions P3 and P5 of the container 21. The image processing unit 120 performs image processing on image data captured at the positions P3 and P5 of the container 21 to measure the distance between the upper portion of the container groove and the wafer placement surface of the fork 59. The image processing unit 120 measures the distance between the edge of the boat groove and the edge of the fork 59.

The autonomous control unit 130 determines whether the distance between the upper portion of the container groove and the wafer placement surface of the fork 59 measured at the positions P3 and P5 of the container 21 and the distance between the edge of the container groove and the edge of the fork 59 satisfy designed reference values. When the designed reference values are not satisfied, the autonomous control unit 130 performs a correction operation of the amount of error, and performs position correction such that the movement operation of the fork 59 satisfies the designed reference value. The autonomous control unit 130 performs feedback by storing the corrected teaching data into the database 160 in accordance with a result of the position correction of the movement operation of the fork 59 that is performed so as to satisfy the designed reference value.

In step S12, the control apparatus 100 performs automatic teaching processing. The automatic teaching processing of step S12 includes performing a movement operation of the forks 59 of the transfer mechanism 47 on the basis of the corrected teaching data obtained by correcting the initial teaching data in the pre-transfer operation confirmation processing of step S10.

The control apparatus 100 acquires image data of the movement operation in which the forks 59 of the transfer mechanism 47 gets the wafer W from the container 21 or 22, and performs image processing to quantify the relationship in the positions of the groove of the container 21 or 22, the fork 59, and the wafer W. The control apparatus 100 outputs corrected teaching data for correcting the placement positions of the wafers W on the container 21 or 22 (correcting the movement operation of the fork 59), on the basis of the relationship of the position of the groove of the container 21 or 22, the fork 59, and the wafer W, which has been quantified.

Furthermore, the control apparatus 100 acquires image data of the movement operation in which the forks 59 of the transfer mechanism 47 puts the wafer W into the boat 44a or 44b, and performs image processing to quantify the relationship in the positions of the groove of the boat 44a or 44b, the fork 59, and the wafer W. The relationship of the positions of the groove of the boat 44a or 44b, the fork 59, and the wafer W may be referred to as, for example, interface dimensions of the boat 44a or 44b and the wafer W.

The control apparatus 100 outputs corrected teaching data for correcting the placement positions of the wafer W on the boat 44a or 44b (correcting the movement operation of the fork 59) on the basis of the relationship of the positions of the grooves of the boat 44a or 44b, the fork 59, and the wafers W, which has been quantified. The details of the automatic teaching processing of step S12 are explained later.

In step S14, the control apparatus 100 performs transfer processing of the wafer W by controlling the movement operation of the transfer mechanism 47 by using the corrected teaching data stored in the database 160, thus operating the thermal processing apparatus 10. In the present embodiment, processing in step S16 and subsequent steps are performed with predetermined intervals, such as regular intervals, while the thermal processing apparatus 10 operates.

In step S16, the autonomous control unit 130 controls the cameras 80a and 80b to capture images at the position P3 or P5 of the boat 44a. The image data acquisition unit 110 acquires image data which the cameras 80a and 80b capture at the position P3 or P5 of the boat 44a, for example, as illustrated in FIG. 7. FIG. 7 is a schematic illustration of an example of a boat into which a fork is inserted. As illustrated in FIG. 7, the cameras 80a and 80b are provided to be able to capture images of boat grooves at three locations of the boat 44a. The cameras 80a are configured to capture images showing error of a placement position in the container in the vertical and horizontal direction. The camera 80b is configured to capture an image showing error of the placement position in the container in a forward-and-backward direction. In this case, the forward-and-backward direction refers to a direction in which the transfer mechanism 47 moves. The cameras 80a are an example of first imaging apparatuses. The camera 80b is an example of a second imaging apparatus.

In step S18, the image processing unit 120 performs image processing on image data which the cameras 80a and 80b capture at the position P3 or P5 of the boat 44a to quantify the relationship of the positions of the boat grooves and the wafer W.

For example, the image processing unit 120 performs image processing on image data which the cameras 80a and 80b capture at the position P5 to measure a distance a between the lower surface of the wafer W held by the fork 59 and the upper surface of the boat groove, a distance b between the support pillar 52 and the edge of the wafer W, and the like. The image processing unit 120 performs image processing on image data which the cameras 80a and 80b capture at the position P3 to measure a distance a between the lower surface of the wafer W held by the fork 59 and the upper surface of the boat groove, a distance b between the support pillar 52 and the edge of the wafer W, and the like.

In step S20, with respect to each of the boat grooves at the three locations, the autonomous control unit 130 compares the relationship of the positions of the boat groove and the wafer W, which has been quantified, with a designed reference value. In step S22, with respect to the boat grooves at the three locations, the autonomous control unit 130 determines whether the designed reference value is satisfied.

For example, the autonomous control unit 130 compares: the distance a between the lower surface of the wafer W held by the fork 59 and the upper surface of the boat groove which has been quantified in step S18; and the designed reference value of the distance a, and determines whether the designed reference value is satisfied, with respect to each of the boat grooves at the three locations, on the basis of the difference. When the difference between: the distance a between the lower surface of the wafer W held by the fork 59 and the upper surface of the boat groove which has been quantified; and the designed reference value of the distance a is determined to be included in a predetermined range (for example, a range that is less than 200 μm), then, the autonomous control unit 130 determines that it is a normal value, which satisfies the designed reference value.

When the difference between: the distance a between the lower surface of the wafer W held by the fork 59 and the upper surface of the boat groove which has been quantified; and the designed reference value of the distance a is determined to be included in a predetermined range (for example, a range that is equal to or more than 200 μm and that is less than 400 μm), it is determined to be a value for which adjustment is recommended, which does not satisfy the designed reference value. Furthermore, when the difference between: the distance a between the lower surface of the wafer W held by the fork 59 and the upper surface of the boat groove which has been quantified; and the designed reference value of the distance a is included in a predetermined range (for example, a range that is equal to or more than 400 μm), it is determined to be an abnormal value, which does not satisfy the designed reference value.

Furthermore, for example, the autonomous control unit 130 compares: the distance b between the edge of the wafer W held by the fork 59 and the support pillar 52, which has been quantified in step S18; and the designed reference value of the distance b, and determines whether the designed reference value is satisfied, with respect to each of the boat grooves at the three locations, on the basis of the difference. When the difference between: the distance b between the edge of the wafer W held by the fork 59 and the support pillar 52, which has been quantified; and the designed reference value of the distance b is determined to be included in a predetermined range (for example, a range that is less than 200 μm), then, the autonomous control unit 130 determines that it is a normal value, which satisfies the designed reference value.

When the difference between: the distance b between the edge of the wafer W held by the fork and the support pillar 52, which has been quantified; and the designed reference value of the distance b is determined to be included in a predetermined range (for example, a range that is equal to or more than 200 μm and that is less than 400 μm), it is determined to be a value for which adjustment is recommended, which does not satisfy the designed reference value. Furthermore, when the difference between: the distance b between the edge of the wafer W held by the fork 59 and the support pillar 52, which has been quantified; and the designed reference value of the distance b is determined to be included in a predetermined range (for example, a range that is equal to or more than 400 μm), it is determined to be an abnormal value, which does not satisfy the designed reference value.

When the designed reference is satisfied with respect to boat groove(s) at one or more locations, the autonomous control unit 130 performs processing of step S24. In step S24, the autonomous control unit 130 performs the correction operation of the difference (misalignment amount), and performs feedback by storing the correction data for correcting the corrected teaching data into the database 160 in accordance with a result of the position correction of the movement operation of the fork 59 that satisfies the designed reference value. Therefore, the autonomous control unit 130 can continue the operation of the thermal processing apparatus 10 while the position of the movement operation of the fork 59 is corrected so as to satisfy the designed reference value.

Although processing of continuing the operation of the thermal processing apparatus 10 while correcting the position of the movement operation of the fork 59 if the difference is a normal value that satisfies the designed reference with respect to boat groove(s) at one or more locations is explained as an example in FIG. 5, the embodiment is not limited thereto. For example, when the designed reference is determined not to be satisfied with respect to the boat grooves at three locations but the difference is included in the range of the value for which adjustment is recommended, the autonomous control unit 130 may continue the operation of the thermal processing apparatus 10 while correcting the position of the movement operation of the fork 59 until the currently processed batch is finished. Also, when the difference is determined to be included in the range of the abnormal value that does not satisfy the designed reference with respect to boat groove(s) at one or more locations, the autonomous control unit 130 may abort the operation of the thermal processing apparatus 10 before the currently processed batch is finished.

When the designed reference is not satisfied with respect to the boat grooves at three locations, the autonomous control unit 130 returns back to the processing of step S12 to perform the automatic teaching processing as illustrated in FIG. 8 to FIG. 11.

Figure 8:
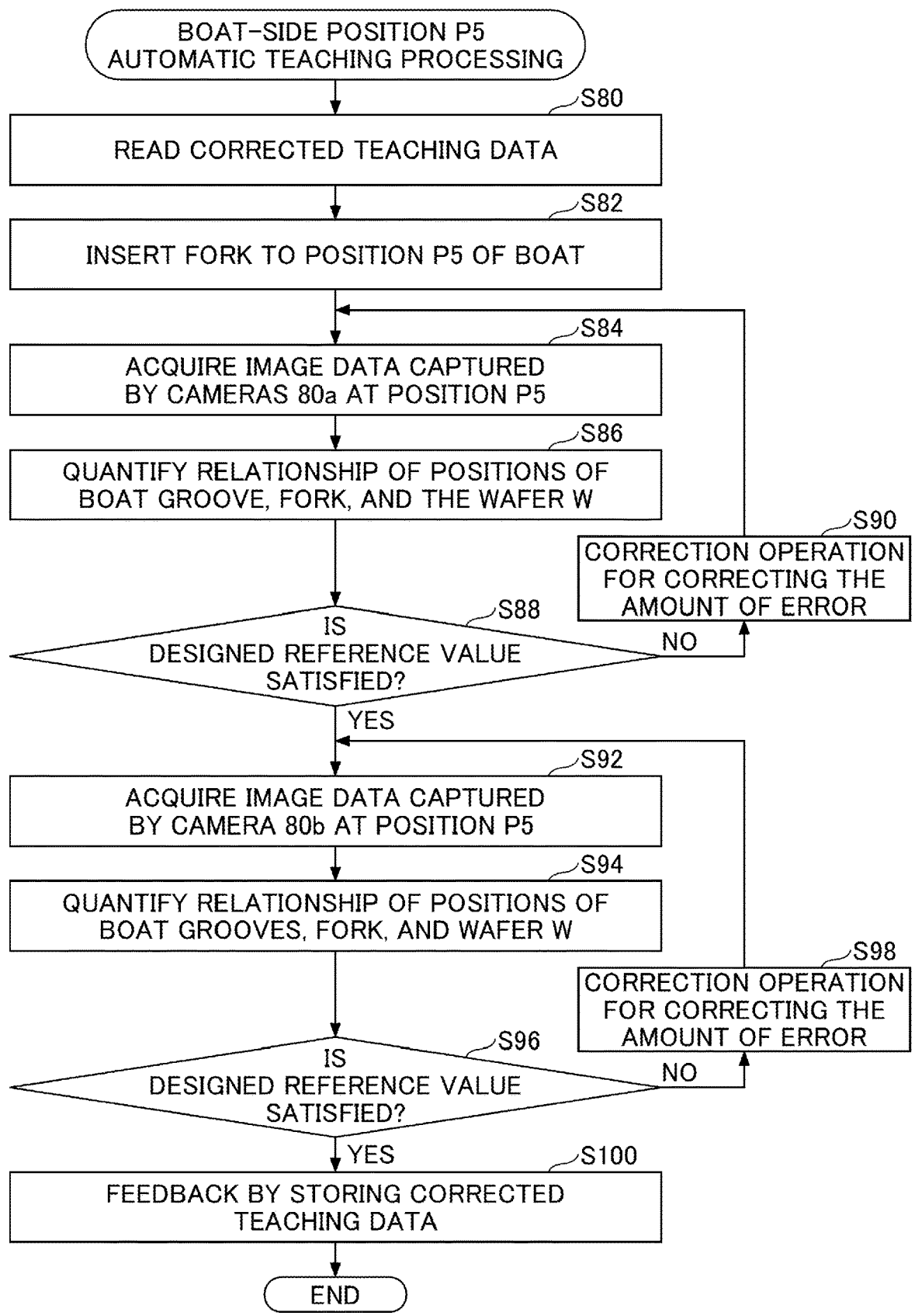
FIG. 8 is a flowchart of an example of boat-side automatic teaching processing according to the present embodiment.

FIG. 8 is a flowchart of an example of the boat-side automatic teaching processing according to the present embodiment. The autonomous control unit 130 of the control apparatus 100 reads the corrected teaching data from the database 160 in step S80.

Figure 9:
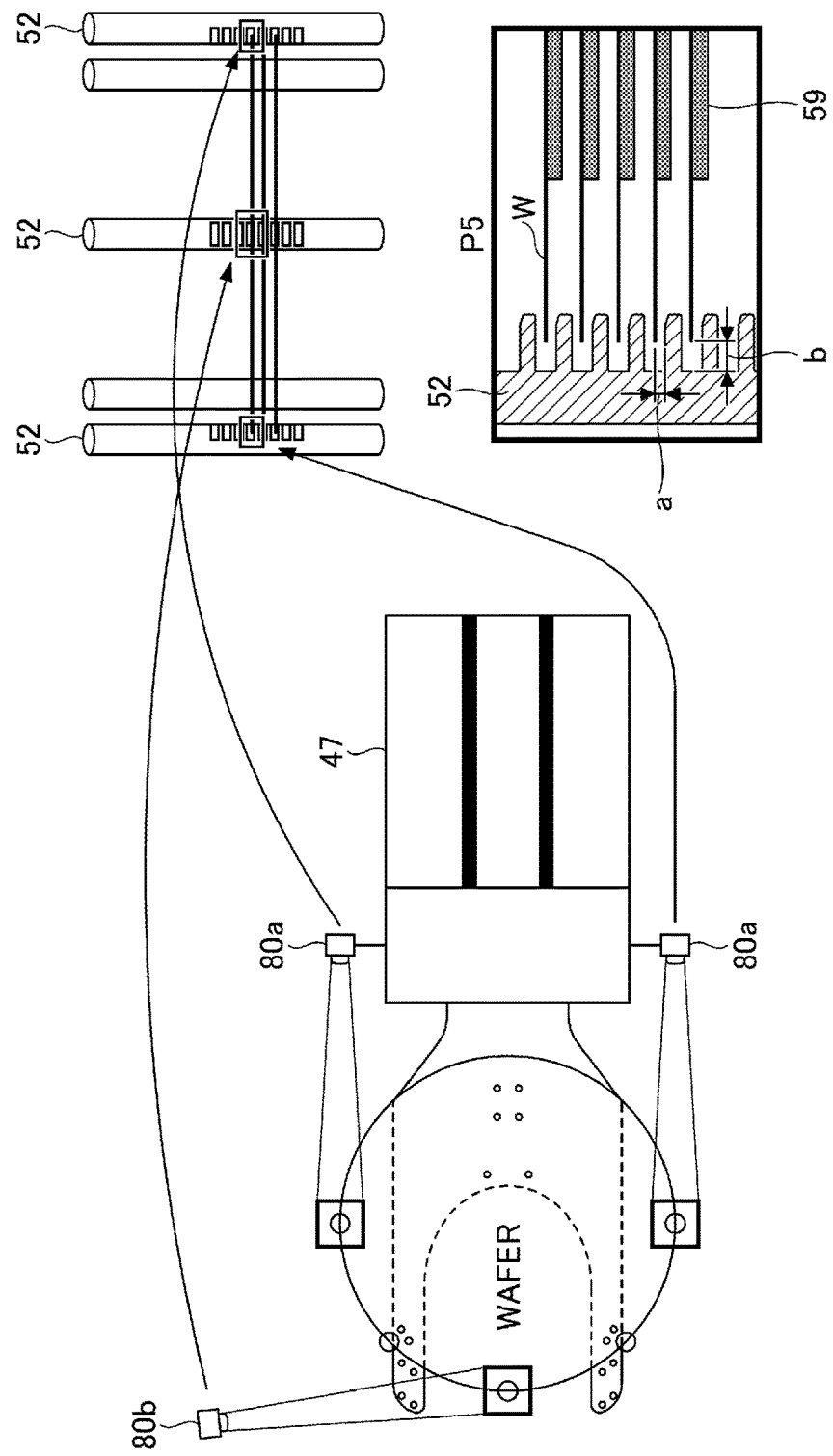
FIG. 9 is a schematic illustration of an example of a boat in which a fork is inserted to a position P5.

In step S82, the autonomous control unit 130 controls the conveying apparatus control unit 150 so as to insert the fork 59 to the position P5 of the boat 44a on the basis of the corrected teaching data. For example, as illustrated in FIG. 9, the conveying apparatus control unit 150 controls the movement operation of the transfer mechanism 47 such that the fork 59 is inserted to the position P5 of the boat 44a according to the corrected teaching data. FIG. 9 is a schematic illustration of an example of a boat in which the fork is inserted to the position P5.

In step S84, the autonomous control unit 130 controls the cameras 80a to capture images at the position P5 of the boat 44a. The image data acquisition unit 110 acquires image data which the cameras 80a capture at the position P5 of the boat 44a.

In step S86, the image processing unit 120 performs image processing on image data which the cameras 80a capture at the position P5 of the boat 44a to quantify the relationship of the positions of the boat grooves, the fork 59, and the wafer W.

For example, the image processing unit 120 performs image processing on image data which the cameras 80a capture at the position P5 to measure the distance a between the lower surface of the wafer W held by the fork 59 and the upper surface of the boat groove, the distance b between the support pillar 52 and the edge of the wafer W, and the like.

In step S88, the autonomous control unit 130 determines whether the measured distance satisfies the designed reference value. When the designed reference value is determined not to be satisfied, the autonomous control unit 130 performs, in step S90, a correction operation of the amount of error to repeatedly perform the position correction of the movement operation of the fork 59 until the designed reference value is satisfied.

When the designed reference value is satisfied, the autonomous control unit 130 proceeds to the processing of step S92. The autonomous control unit 130 controls the camera 80b to capture images at the position P5 of the boat 44a. The image data acquisition unit 110 acquires image data which the camera 80b captures at the position P5 of the boat 44a.

In step S94, the image processing unit 120 performs image processing on image data which the camera 80b captures at the position P5 of the boat 44a to quantify the relationship of the positions of the boat grooves, the fork 59, and the wafer W.

For example, the image processing unit 120 performs image processing on image data which the camera 80b captures at the position P5 to measure the distance a between the lower surface of the wafer W held by the fork 59 and the upper surface of the boat groove, the distance b between the support pillar 52 and the edge of the wafer W, and the like.

In step S96, the autonomous control unit 130 determines whether the measured distance satisfies the designed reference value. When the designed reference value is not satisfied, the autonomous control unit 130 performs a correction operation of the amount of error in step S98 to repeatedly perform the position correction of the movement operation of the fork 59 until the designed reference value is satisfied.

In step S100, the autonomous control unit 130 performs feedback by storing the corrected teaching data into the database 160 in accordance with a result of the position correction of the movement operation of the fork 59 that satisfies the designed reference value.

Figure 10:
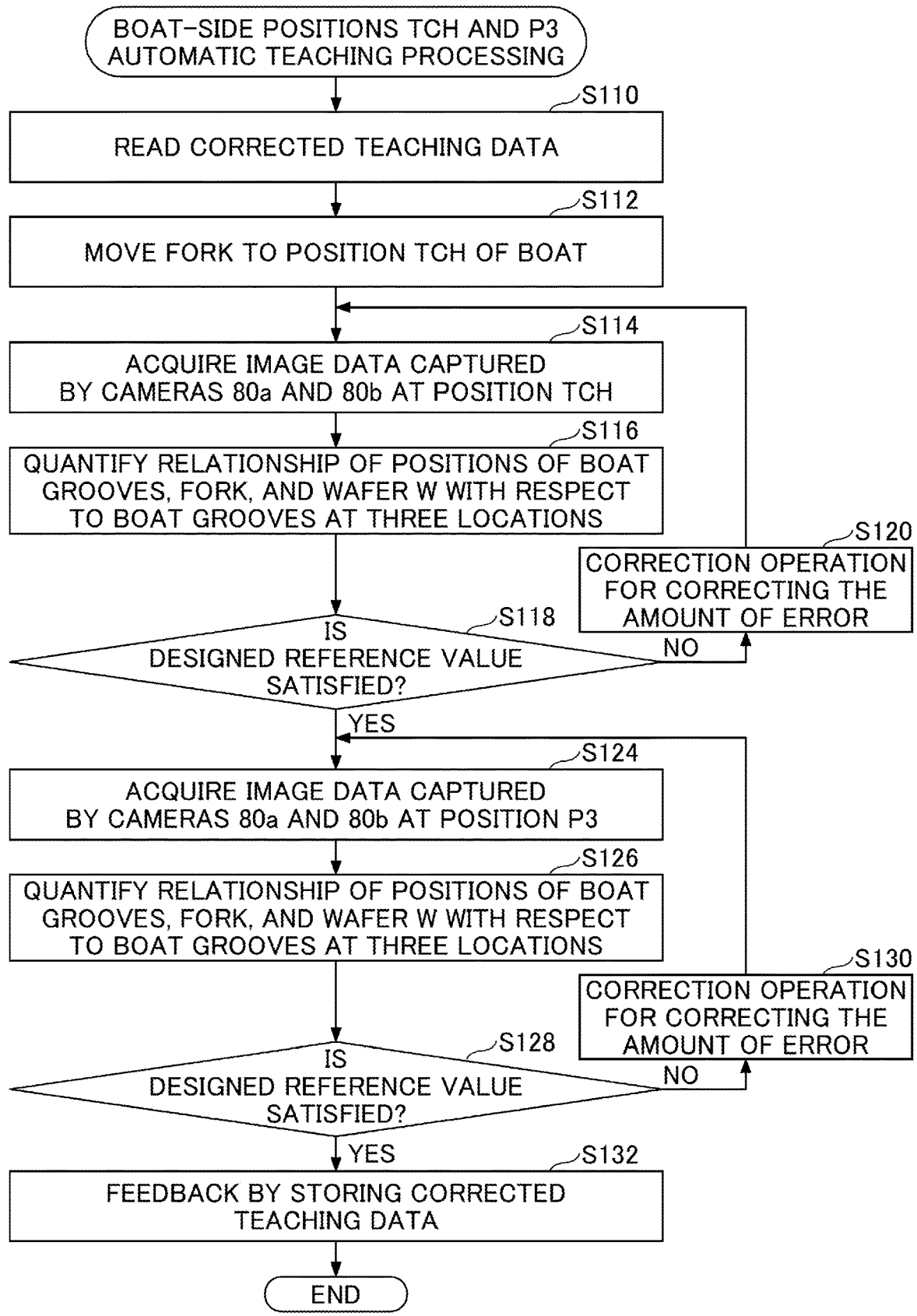
FIG. 10 is a flowchart of an example of boat-side automatic teaching processing according to the present embodiment.

FIG. 10 is a flowchart of an example of boat-side automatic teaching processing according to the present embodiment. The autonomous control unit 130 of the control apparatus 100 reads corrected teaching data from the database 160 in step S110.

In step S112, the autonomous control unit 130 controls the conveying apparatus control unit 150 so as to move the fork 59 to the position TCH of the boat 44a on the basis of the corrected teaching data. The conveying apparatus control unit 150 controls the movement operation of the transfer mechanism 47 so as to move the fork 59 to the position TCH of the boat 44a in accordance with the corrected teaching data, for example, as illustrated in FIG. 11.

Figure 11:
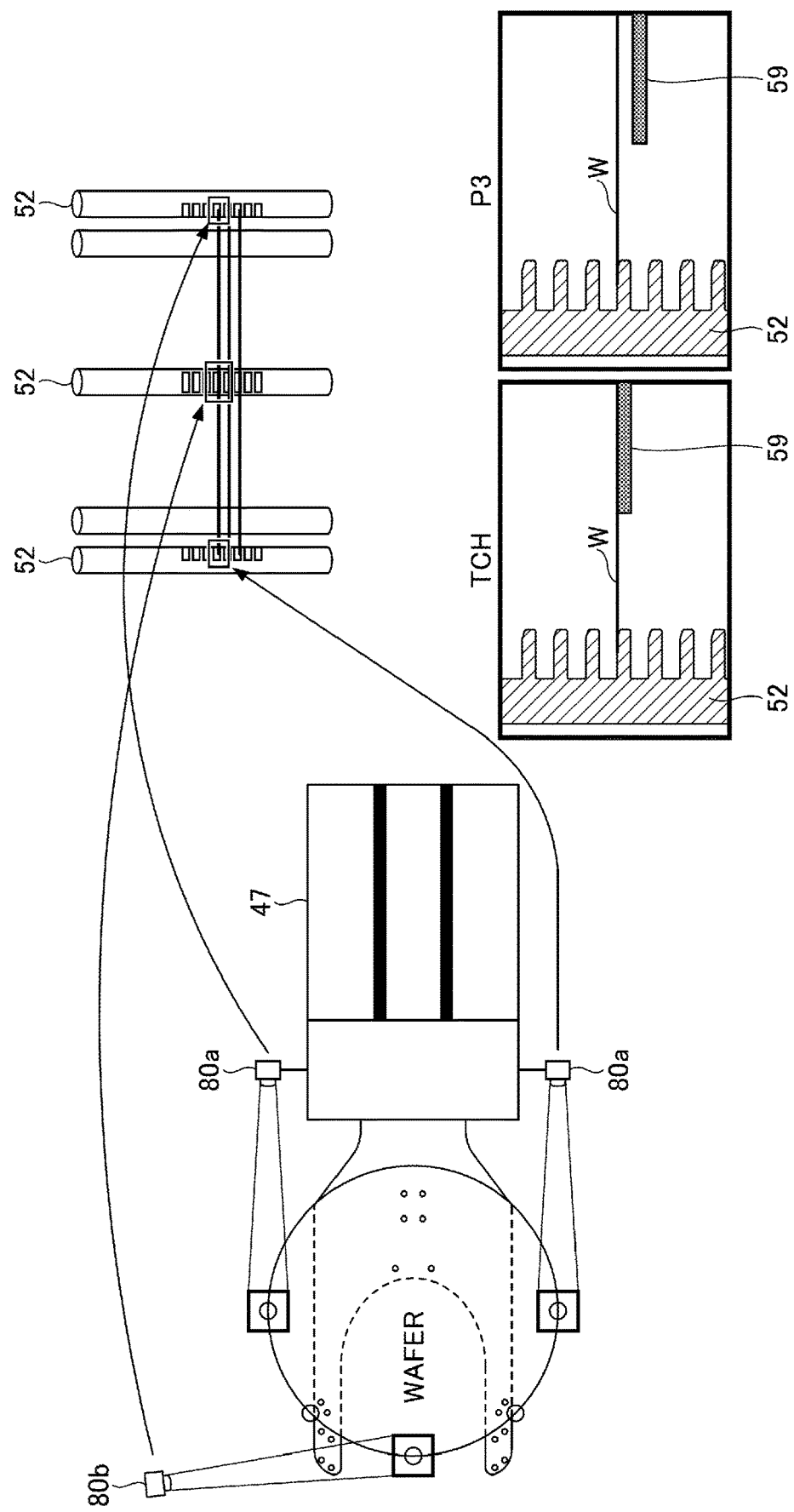
FIG. 11 is a schematic illustration of an example of a boat where a fork is inserted to positions TCH and P3.

FIG. 11 is a schematic illustration of an example of a boat of which a fork is inserted to the positions TCH and P3. As illustrated in FIG. 11, the cameras 80a and 80b are provided to be able to capture an image of the boat grooves of the boat 44a at three locations while the transfer mechanism 47 is moved to the positions TCH and P3.

In step S114, the autonomous control unit 130 controls the cameras 80a and 80b to capture images at the position TCH of the boat 44a. The image data acquisition unit 110 acquires image data which the cameras 80a and 80b capture at the position TCH of the boat 44a.

In step S116, the image processing unit 120 performs image processing on image data which the cameras 80a and 80b capture at the position TCH of the boat 44a to quantify the relationship of the positions of the boat grooves, the fork 59, and the wafer W with respect to the boat grooves at three locations.

For example, the image processing unit 120 performs image processing on image data which the cameras 80a and 80b capture at the position TCH to measure the distance between the lower surface of the wafer W held by the fork 59 and the upper surface of the boat groove, the distance between the support pillar 52 and the edge of the wafer W, and the like.

In step S118, the autonomous control unit 130 determines whether the measured distance satisfies designed reference value. When the designed reference value is not satisfied, the autonomous control unit 130 performs, in step S120, the correction operation of the amount of error to repeatedly perform the position correction of the movement operation of the fork 59 until the designed reference value is satisfied.

When the designed reference value is satisfied, the autonomous control unit 130 proceeds to the processing of step S124. The autonomous control unit 130 controls the cameras 80*a* and 80*b* to capture images at the position P3 of the boat 44*a*. The image data acquisition unit 110 acquires image data which the cameras 80*a* and 80*b* capture at the position P3 of the boat 44*a*.

In step S126, the image processing unit 120 performs image processing on image data which the cameras 80*a* and 80*b* capture at the position P3 of the boat 44*a* to quantify the boat grooves at three locations with respect to the relationship of the positions of the boat grooves, the fork 59, and the wafer W.

For example, the image processing unit 120 performs image processing on image data which the cameras 80*a* and 80*b* capture at the position P3 to measure the distance between the lower surface of the wafer W held by the boat groove and the wafer placement surface of the fork 59, the distance between the support pillar 52 and the edge of the wafer W, and the like.

In step S128, the autonomous control unit 130 determines whether the measured distance satisfies the designed reference value. When the designed reference value is determined not to be satisfied, the autonomous control unit 130 performs, in step S130, the correction operation of the amount of error to repeatedly perform the position correction of the movement operation of the fork 59 until the designed reference value is satisfied.

In step S132, the autonomous control unit 130 performs feedback by storing the corrected teaching data into the database 160 in accordance with a result of the position correction of the movement operation of the fork 59 that satisfies the designed reference value.

In the processing of the flowchart as illustrated in FIG. 8 and FIG. 10, depending on the height, the boat 44*a* may be divided into two areas or three or more areas in the vertical direction, and the processing may be performed on each area, so that the accuracy can be improved.

According to the present embodiment, processing in step S16 and subsequent steps is performed at predetermined intervals during the operation of the thermal processing apparatus 10, so that the operation of the thermal processing apparatus 10 can be continued while the position of the movement operation of the fork 59 is corrected so as to satisfy the designed reference value. Therefore, according to the present embodiment, the MTBF (Mean Time Between Failures) can extended, and the operating ratio is improved, so that the additional value of the thermal processing apparatus 10 can be improved. Furthermore, according to the present embodiment, the MTTR (Mean Time To Repair) can be reduced, and the operating ratio and quality are improved, so that the additional value of the thermal processing apparatus 10 can be improved.

Furthermore, according to the present embodiment, for example, the actions of the transfer mechanism 47 and the boat 44 can be determined by analyzing the displacement data stored in the database 160. Furthermore, according to the present embodiment, abnormality detection and malfunction detection can be facilitated by analyzing the displacement data stored in the database 160, so that the additional value of the thermal processing apparatus 10 can be improved. For example, thermal displacement actions of the thermal processing apparatus 10 can be logged by analyzing the displacement data stored in the database 160, and an appropriate time of maintenance can be notified by performing prediction before the displacement data exceeds the amount of physical change indicated by the machine design.

As described above, according to the autonomous transfer processing of the present embodiment, the MTBF due to conveying of the wafer W can be extended, as long as the physical limitation of the transfer mechanism 47 and the deposition distribution limitation of the process are exceeded. For example, the deposition distribution limitation of the process may be detected from an adjustment limitation of an eccentricity optimizer function.

Furthermore, according to the present embodiment, for example, as compared with adjustment work performed by a worker, the time required at the start-up (installation of the apparatus) or during adjustment work after replacement of a quartz jig can be reduced, and furthermore, the transfer margin achieved by highly accurate adjustment can be increased. Furthermore, according to the present embodiment, with the increase of the transfer margin, the MTTF (Mean Time to Failure) is expected to increase, and the additional value of the thermal processing apparatus 10 can be improved.

Furthermore, although, in the present embodiment, the relationship between the position of the support portion such as the groove or claw of the container 21 or 22, the position of the support portion such as the groove or claw of the boat 44*a* or 44*b*, and the position of the fork 59 of the transfer mechanism 47, and the position of the wafer W is quantified by image processing, an optical sensor and the like may also be used. Furthermore, in the present embodiment, centering of the wafer W on the boat 44*a* or 44*b* can be achieved, and the inclination of the boat 44*a* or 44*b* can be analyzed by performing calculation based on the transfer mechanism 47. Furthermore, in the present embodiment, misalignment of the wafer W held by the fork 59 may be analyzed from image data captured by the camera 80*b*, and transfer of the wafer W may be continued upon correcting the deviation of the misalignment.

In the above-described embodiment, the boat is assumed to be a ladder boat provided with multiple support pillars between the top panel and the bottom plate, which are provided opposite to each other in the vertical direction, with multiple groove portions formed on the inner side surface of each support pillar so that the peripheral portion of the wafer W is inserted to the groove portion, but the boat is not limited to the shape of the ladder boat.

For example, the above-described embodiment can also be applied to a ring boat provided with multiple support pillars between the top panel and the bottom plate, which are provided opposite to each other in the vertical direction, with ring members having flat support surfaces being provided on the multiple support pillars such that the wafer W is supported by the support surface of the ring member. Furthermore, the above-described embodiment can also be applied to other boats having special shapes.

According to the present disclosure, a conveying apparatus can be autonomously controlled to convey a substrate.

It should be understood that the embodiment of the present disclosure is exemplary and not restrictive in all respects. Further, the above-described embodiment may be omitted, replaced, or modified in various forms without departing from the subject matter described in the attached claims.

The present invention is not limited to the configurations described in the above-described embodiments in regard to, for example, combinations with other elements and the like. The embodiments of the present disclosure can be changed without departing from the subject matter described in the attached claims, and can be defined as appropriate according to the form of application thereof.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. An information processing apparatus for controlling a conveying apparatus to convey a substrate to be processed by a substrate processing apparatus, the information processing apparatus comprising:
    a processor; and
    a memory storing instructions that, when executed by the processor, perform operations comprising:
    controlling the conveying apparatus, according to teaching data, to perform a first movement operation including putting the substrate into a container configured to carry the substrate and a second movement operation including getting the substrate from the container;
    acquiring image data including an image, captured by an imaging apparatus, of a placement position for the substrate in the container during the first movement operation and the second movement operation, said imaging apparatus including a first imaging apparatus attached to the conveying apparatus, and said imaging apparatus further including a second imaging apparatus provided on a lateral wall of the substrate processing apparatus so as to capture an image of a back side of the container relative to the conveying apparatus, said lateral wall being provided between a top plate and bottom plate of the substrate processing apparatus;
    performing image processing on the image data to quantify a relationship between a position of the container and a position of the substrate; and
    determining the quantified relationship between the position of the container and the position of the substrate to yield a determination result, and
    outputting correction data for correcting the conveying apparatus with respect to the first movement operation and the second movement operation, based on the determination result,
        wherein, the container has three support pillars, each having a support portion that supports the substrate in the container that carries the substrate;
        the acquiring of the image data further comprises acquiring the image data with which a relationship of the position of the substrate and positions of at least three support portions can be quantified through the image processing, said at least three support portions including grooves or claws that extend in radial directions of the substrate,
        the performing of the image processing, performed by the imaging apparatus including the first imaging apparatus and the second imaging apparatus further comprises quantifying, with respect to each of the at least three support portions, the relationship between the position of the substrate and the position of the each of the at least three support portions that support the substrate in the container that carries the substrate,
        the determining further comprises determining, with respect to the each of the at least three support portions, the quantified relationship of the position of the substrate and the position of the each of the at least three support portions that support the substrate in the container that carries the substrate to yield the determination result, and
        the outputting further comprises outputting the correction data for correcting the conveying apparatus with respect to the first movement operation and the second movement operation, based on the determination result.

2. The information processing apparatus according to claim 1, wherein the determining further comprises comparing the quantified relationship between the position of the container and the position of the substrate, with a designed reference value of the relationship to yield the determination result, and
    the outputting further comprises:
        outputting, in response to determining that the determination result is not in an abnormal range, correction data for correcting the conveying apparatus with respect to the first movement operation and the second movement operation, based on the determination result; and
        requesting, in response to determining that the determination result is in the abnormal range, teaching of the conveying apparatus with respect to the first movement operation and the second movement operation.

3. The information processing apparatus according to claim 1, wherein the performing of the image processing further comprises quantifying a relationship between the placement position in the container, a position of the conveying apparatus, and the position of the substrate, and
    the outputting further comprises requesting teaching of the conveying apparatus with respect to the first movement operation and the second movement operation for putting and getting the substrate at the placement position in the container.

4. The information processing apparatus according to claim 1, wherein the performing of the image processing further comprises performing the image processing on first image data captured when the conveying apparatus moves to a first position before the conveying apparatus gets the substrate in the second movement operation of the conveying apparatus and on second image data captured when the conveying apparatus moves to a second position before the conveying apparatus puts the substrate in the first movement operation of the conveying apparatus to quantify a relationship between the position of the container and the position of the substrate at each of the first position and the second position,
    the determining further comprises determining the quantified relationship between the position of the container and the position of the substrate at each of the first position and the second position to yield the determination result, and the outputting further comprises outputting the correction data for correcting the conveying apparatus with respect to the first movement operation and the second movement operation, based on the determination result.

5. The information processing apparatus according to claim 1, wherein the conveying apparatus can perform the first movement operation and the second movement operation in vertical and horizontal directions and a forward-and-backward direction, and the imaging apparatus includes:
a plurality of first imaging apparatuses configured to capture the image showing error of the placement position in the container in the vertical and horizontal directions; and
at least one second imaging apparatus configured to capture the image showing error of the placement position in the container in the forward-and-backward direction.

6. The information processing apparatus according to claim 1, wherein the substrate comprises a plurality of substrates, and the container is a boat configured to support the plurality of substrates conveyed by the conveying apparatus.

7. The information processing apparatus according to claim 1, wherein the first movement operation includes an operation of the conveying apparatus immediately before the substrate is placed in the container, and the second movement operation includes an operation of the conveying apparatus immediately before the substrate is retrieved from the container.

8. The information processing apparatus according to claim 1, wherein the container is configured to accommodate the substrate and be loaded into a processing container together with the substrate.

9. A transfer position correction method executable by an information processing apparatus for controlling a conveying apparatus to convey a substrate to be processed by a substrate processing apparatus, the information processing apparatus including a processor and a memory storing instructions that, when executed by the processor, cause the information processing apparatus to perform the transfer position correction method comprising:

controlling the conveying apparatus, according to teaching data, to perform a first movement operation including putting the substrate into a container capable of carrying the substrate and a second movement operation including getting the substrate from the container;

acquiring image data including an image, captured by an imaging apparatus, of the substrate at a placement position in the container during the first movement operation and the second movement operation, said imaging apparatus including a first imaging apparatus attached to the conveying apparatus, and said imaging apparatus further including a second imaging apparatus provided on a wall of the substrate processing apparatus so as to capture an image of a back side of the container relative to the conveying apparatus;

performing image processing on the image data to quantify a relationship between a position of the container and a position of the substrate; and determining the quantified relationship between the position of the container and the position of the substrate to yield a determination result, and outputting correction data for correcting the conveying apparatus with respect to the first movement operation and the second movement operation, based on the determination result, wherein, the container has three support pillars, each having a support portion that supports the substrate in the container that carries the substrate;

the acquiring of the image data further comprises acquiring the image data with which a relationship of the position of the substrate and positions of at least three support portions can be quantified through the image processing, said at least three support portions including grooves or claws that extend in radial directions of the substrate, the performing of the image processing, performed by the imaging apparatus including the first imaging apparatus and the second imaging apparatus further comprises quantifying, with respect to each of the at least three support portions, the relationship between the position of the substrate and the position of the each of the at least three support portions that support the substrate in the container that carries the substrate, the determining further comprises determining, with respect to the each of the at least three support portions, the quantified relationship of the position of the substrate and the position of the each of the at least three support portions that support the substrate in the container that carries the substrate to yield the determination result, and the outputting further comprises outputting the correction data for correcting the conveying apparatus with respect to the first movement operation and the second movement operation, based on the determination result.

10. A substrate processing apparatus for processing a substrate, comprising:

a conveying mechanism configured to put the substrate into a container configured to carry the substrate or get the substrate from the container;

an imaging apparatus provided to be able to capture an image of a placement position for the substrate in the container;

a processor; and a memory storing instructions that, when executed by the processor, perform operations comprising:

controlling the conveying mechanism, according to teaching data, to perform a first movement operation including putting the substrate into the container and a second movement operation including getting the substrate from the container;

acquiring image data including an image, captured by the imaging apparatus, of the placement position for the substrate in the container during the first movement operation and the second movement operation, said imaging apparatus including a first imaging apparatus attached to the conveying apparatus, and said imaging apparatus further including a second imaging apparatus provided on a wall of the substrate processing apparatus so as to capture an image of a back side of the container relative to the conveying apparatus;

performing image processing on the image data to quantify a relationship between a position of the container and a position of the substrate; and determining the quantified relationship between the position of the container and the position of the substrate to yield a determination result, and outputting correction data for correcting the conveying mechanism with respect to the first movement operation and the second movement operation, based on the determination result,
wherein, the container has three support pillars, each having a support portion that supports the substrate in the container that carries the substrate;
the acquiring of the image data further comprises acquiring the image data with which a relationship of the position of the substrate and positions of at least three support portions can be quantified through the image processing, said at least three support portions including grooves or claws that extend in radial directions of the substrate,
the performing of the image processing, performed by the imaging apparatus including the first imaging apparatus and the second imaging apparatus further comprises quantifying, with respect to each of the at least three support portions, the relationship between the position of the substrate and the position of the each of the at least three support portions that support the substrate in the container that carries the substrate,
the determining further comprises determining, with respect to the each of the at least three support portions, the quantified relationship of the position of the substrate and the position of the each of the at least three support portions that support the substrate in the container that carries the substrate to yield the determination result, and
the outputting further comprises outputting the correction data for correcting the conveying apparatus with respect to the first movement operation and the second movement operation, based on the determination result.

* * * * *